United States Patent
Kriz et al.

(10) Patent No.: US 6,259,295 B1
(45) Date of Patent: Jul. 10, 2001

(54) VARIABLE PHASE SHIFTING CLOCK GENERATOR

(75) Inventors: John C. Kriz, Palmerton, PA (US); Juergen Pianka, Bloomfield Towwship, MI (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/340,815

(22) Filed: Jun. 28, 1999

(51) Int. Cl.[7] ....................................................... G06F 01/04
(52) U.S. Cl. .......................... 327/296; 327/269; 327/149
(58) Field of Search .................................... 327/270, 296, 327/149, 144, 2, 3, 269, 152, 293

(56) References Cited

U.S. PATENT DOCUMENTS

| | | | |
|---|---|---|---|
| 4,626,911 | 12/1986 | Sasaki et al. | 358/141 |
| 5,107,264 | 4/1992 | Novof | 341/101 |
| 5,436,939 | 7/1995 | Co et al. | 375/376 |
| 5,633,608 | * 5/1997 | Danger | 327/270 |
| 5,689,530 | 11/1997 | Honaker, Jr. | 375/286 |
| 5,786,732 | 7/1998 | Nielson | 331/1 A |
| 5,815,041 | 9/1998 | Lee et al. | 331/8 |
| 5,838,204 | 11/1998 | Yao | 331/1 R |
| 5,838,205 | 11/1998 | Ferraiolo et al. | 331/2 |
| 5,864,250 | 1/1999 | Deng | 327/165 |
| 6,005,447 | * 12/1999 | Huang | 331/44 |

* cited by examiner

Primary Examiner—Toan Tran
Assistant Examiner—Cassandra Cox
(74) Attorney, Agent, or Firm—Synnesvedt & Lechner LLP

(57) ABSTRACT

A method and apparatus is disclosed for generating, based upon user input, clock signals which are delayed by sub-delays which are of a size that is smaller than the smallest achievable delay of a conventional delay element. A user can selectively add one or more sub-delays by providing control inputs which define the desired number of sub-delays to be added.

9 Claims, 5 Drawing Sheets

VARIABLE PHASE SHIFTING CLOCK GENERATOR

FIELD OF THE INVENTION

The present invention relates to the generation of periodic waveforms and, more particularly, to a clock phase generator which can generate a plurality of sub-clock phases in between the standard clock phases.

BACKGROUND OF THE INVENTION

For many analog and digital applications, it is necessary to generate clock signals which have well defined, known clock phases. Such applications include data and clock recovery circuits, data acquisition systems, pulse wave modulation generators and clock multipliers.

FIG. 1 illustrates a typical clock signal $C_1$ having a period P. A phase delay D can be introduced by delaying the clock by a time period of D (e.g., two nanoseconds) and outputting the delayed clock signal as a second clock output $C_2$.

Thus, for example, if clock signal $C_1$ has a period P of 8 nanoseconds, then by introducing a two nanosecond delay D to each successive clock signal, four clock signals, $C_1$ through $C_4$, can be utilized for control purposes, all generated based on the first clock signal $C_1$.

Using prior art techniques, evenly spaced clock signals are generated with multi-phase clock generators and delay-locked loops (DLLs). U.S. Pat. No. 5,436,939 to Co et al., incorporated herein by reference, teaches one such multi-phase clock generator. Both multi-phase clock generators and DLLs use a series of delay elements to generate a plurality of output clock signals from "taps"; the phase delay D associated with a particular tap is referred to as a "tap delay." Using these prior art schemes, the size of the tap delay is limited by the speed of the intrinsic delay of the delay cell plus the delay from the load the delay cell drives. For example, it is common to utilize a series of inverters in a voltage controlled oscillator (VCO) to implement the phase delay D; however, the smallest possible delay using state-of-the-art inverters is 200 pS. Thus, for example, across an 8 nanosecond (8000 pS) period, the maximum number of taps that could be available would be 40 (8000 pS÷200 pS=40). Therefore, conventional multi-phase clock generators and DLLs are not suitable for applications requiring tap delays that are smaller than the intrinsic delay of the delay cell. Further, conventional multi-phase clock generators and DLLs are unsuitable for applications requiring variable phase shifting clock signals, since they cannot output clock signals that have a variable phase delay.

Accordingly, there exists a need for a multi-phase clock generator which can produce a variable phase shifting clock signal with tap delays that are less than the intrinsic delay of conventional delay cells.

SUMMARY OF THE INVENTION

According to the present invention, the minimum and maximum delay values achievable by a standard multi-phase clock generator or DLL are determined to establish a range of potential delays of the clock generator, and then sub-taps or "virtual taps" are embedded within the delay range to enable smaller delays to be selected and added to the output clock signal from each tap.

DETAILED DESCRIPTION OF THE PREFERRED EMBODIMENT

Figure 2:
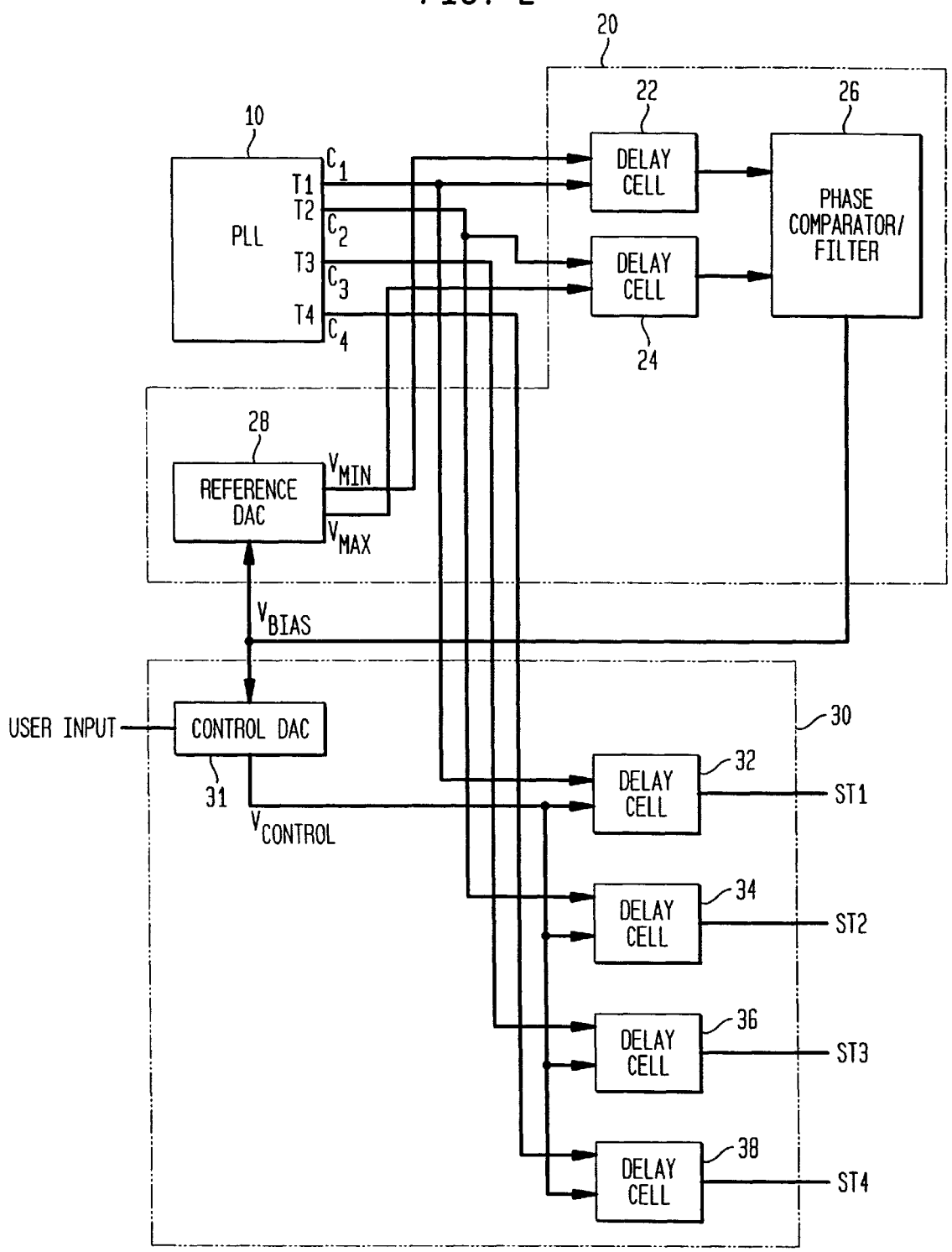
FIG. 2 is a block diagram of a variable phase delay circuit in accordance with the present invention.

FIG. 2 illustrates a variable phase delay circuit in accordance with the present invention. A standard PLL 10 generates a plurality of phase-shifted clock signals $C_1$, $C_2$, $C_3$, and $C_4$ (in this example, four) out of taps $T_1$, $T_2$, $T_3$, and $T_4$, respectively, in a known manner. The PLL 10 generates these equally-spaced, fixed clock signals, each of which have a predetermined phase alignment with respect to the first clock signal output from tap $T_1$. Two adjacent taps (T1 and T2 in this case) are output to a reference feedback loop 20 and some or all taps (T1 through T4 in this case) are output to phase control block 30.

Reference loop 20 comprises a pair of conventional delay cells 22 and 24 (e.g., current-starved delay cells) coupled to receive clock outputs from taps $T_1$ and $T_2$, respectively; a conventional phase comparator/filter 26; and a reference Digital-to-Analog Convertor (DAC) 28. The purpose of reference loop 20 is to add an extra delay to the output of delay cell 22 so that the output of delay cell 22 is phase aligned to the output of delay cell 24. The outputs of delay cell 22 and delay cell 24 are input to phase comparator 26. In a known manner phase comparator 26 outputs a voltage $V_{BIAS}$ corresponding to the difference in phase between the outputs of delay cells 22 and 24. If this comparison indicates that the phase output from delay cell 24 leads the phase output from delay cell 22, then $V_{BIAS}$ is adjusted until the phases of each delay cell overlap (i.e., are phase aligned). If the output from delay cell 24 lags the output from delay cell 22, the $V_{BIAS}$ is adjusted in the opposite direction until the outputs of the two delay cells 22 and 24 are phase aligned. Thus, in the reference loop 20, the phase differences between the output from delay cell 22 and the output from delay cell 24 are integrated with a negative feedback loop to keep their outputs phase aligned.

Figure 3:
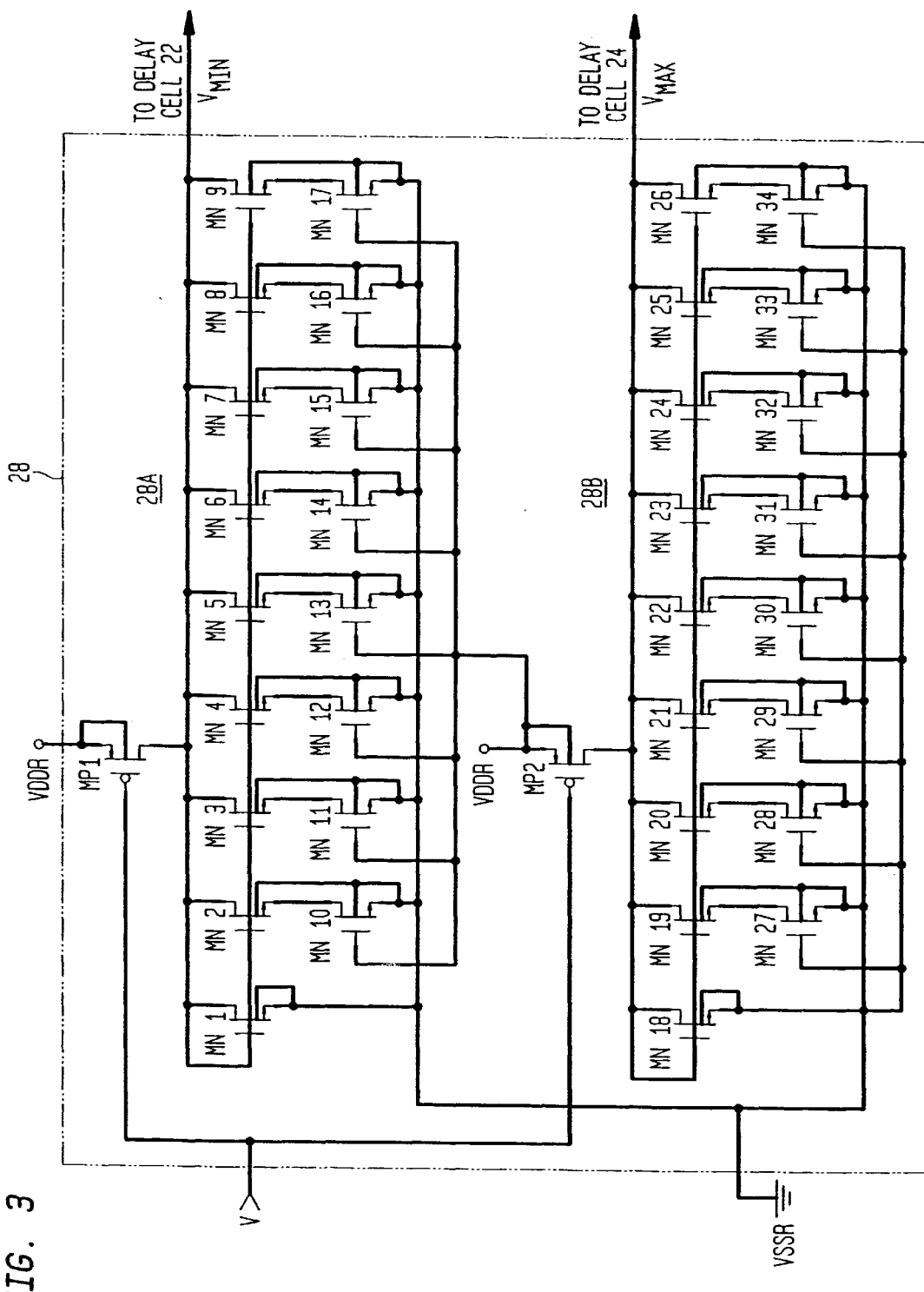
FIG. 3 illustrates an exemplary embodiment of a reference DAC in accordance with the present invention.

FIG. 3 illustrates one exemplary embodiment of reference DAC 28. As shown in FIG. 3, reference DAC 28 comprises two similar DACs 28A and 28B. DAC 28A comprises a series of nine diode-connected N-channel Field Effect Transistors (NFETs) MN1 through MN9 and eight control NFETs MN10 through MN17. NFET MN1 acts as a base diode or pedestal diode that is always "on" (i.e., always acting as a diode) and NFETs MN2 through MN9 are controlled by NFETS MN10 through MN17 to have their gates connected to $V_{DD}$ so that they also remain "on" at all times. A P-channel field effect transistor (PFET) MP1 produces a head current that can be increased or decreased to move the phase of the input from tap $T_1$. Thus, the voltage $V_{BIAS}$ coming into DAC 28A is acted upon by all nine diode connected NFETs MN1 through MN9 and outputs a minimum voltage Vmin to delay cell 22. Accordingly, in delay cell 22, the maximum amount of delay is added to the output from $T_1$ and sent to phase comparator 26, and therefore the output of delay cell 22 defines the slowest operation of the delay cells.

DAC 28B operates similarly, but with less gain, to develop a maximum voltage, and therefore a minimum delay, with respect to the output from tap $T_2$. Specifically, NFETs MN18 through MN34 are connected together identically to the connections of MN1 through MN17; however, the gates of control NFETs MN27 through MN34 are grounded and, therefore, NFETs M27 through M34 are always "off" (i.e., they operate to "remove" the diode-connected NFETs from the circuit). The DACs 28A and 28B are therefore different in that DAC 28B creates a voltage bias based only on the effect of the pedestal diode MN18 while DAC 28A creates a bias voltage based on the combined effects of pedestal diode MN1 and diodes MN2 through MN9. Accordingly, DAC 28B operates to provide the maximum amount of voltage to delay cell 24. Thus, the minimum amount of delay (i.e., the intrinsic delay of delay cell 24) is added to the output of $T_2$ at delay cell 24, and therefore the output of delay cell 24 defines the fastest operation of the delay cells.

Although FIGS. 2 and 3 illustrate reference DAC 28 as being formed as part of the integrated circuit, the reference voltages (or currents) supplied by reference DAC 28 can instead be supplied from an off-chip source.

The output voltage $V_{BIAS}$ from phase comparator 26 is also output to a control loop 30 formed by a control DAC 31 and secondary delay cells 32, 34, 36, and 38. Control DAC 31 also receives user input in the form of control signals as described in more detail below with respect to FIG. 4. Thus, control DAC 31 receives the same bias voltage $V_{BIAS}$ from phase comparator 26 as that received by DAC 28, as well as the user control inputs, and generates a control voltage $V_{CONTROL}$ to each of the delay cells 32 through 38. Delay cells 32 through 38 also receive the outputs from taps $T_1$ through $T_4$, respectively, from PLL 20. The control voltage $V_{CONTROL}$ introduces an additional delay to the outputs from taps $T_1$ through $T_4$, and those delayed clocks are output at subtaps $ST_1$ through $ST_4$ (corresponding to delay elements 32 through 38, respectively) based on the delay needs of the user as identified by control voltage $V_{CONTROL}$.

Figure 4:
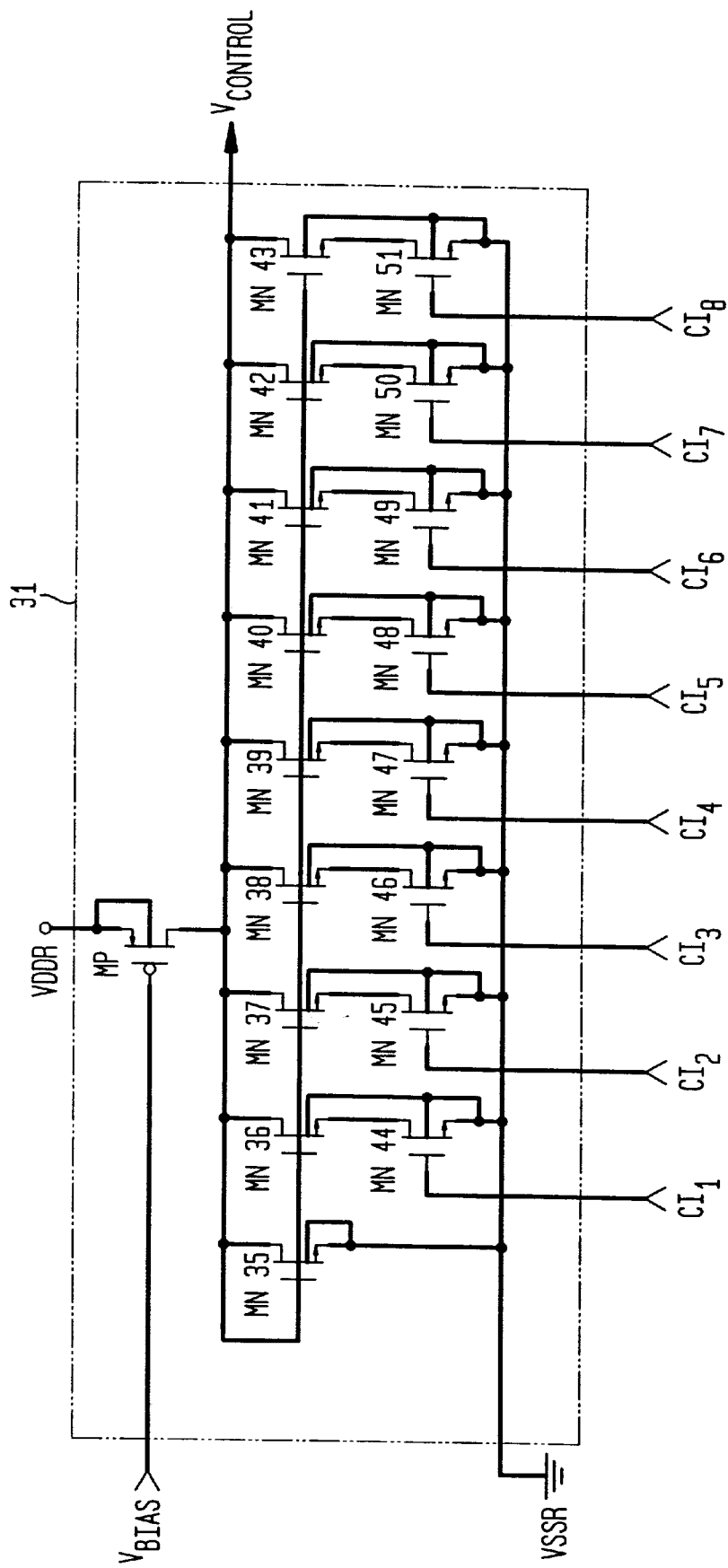
FIG. 4 illustrates an exemplary embodiment of a control DAC in accordance with the present invention.

An exemplary embodiment of control DAC 31 is shown in detail in FIG. 4. Control DAC 31 is identical to control DAC 28A of control DAC 28, with one exception. Instead of having the gates of control transistors MN44 through MN51 connected to $V_{DD}$, control inputs $CI_1$ through $CI_8$ are provided which give the user of the system the ability to selectively turn on or off each of the control transistors MN44 through MN51 and therefore, control the operation of diode-connected transistors MN36 through MN43. This allows the user to selectively control the voltage output from control DAC 31. Thus, the user has up to eight (in this example) "sub-delays" $SD_1$ through $SD_8$ within the range defined by the outputs of taps $T_1$ and $T_2$, each of which can be added to the outputs of tap $T_1$ through $T_4$ by outputting the desired control voltage $V_{CONTROL}$ to delay cells 32, 34, 36 and 38. Thus, the maximum delay available from the delay elements of the system can be increased to an even longer delay, in increments selected by the user.

Figure 1:
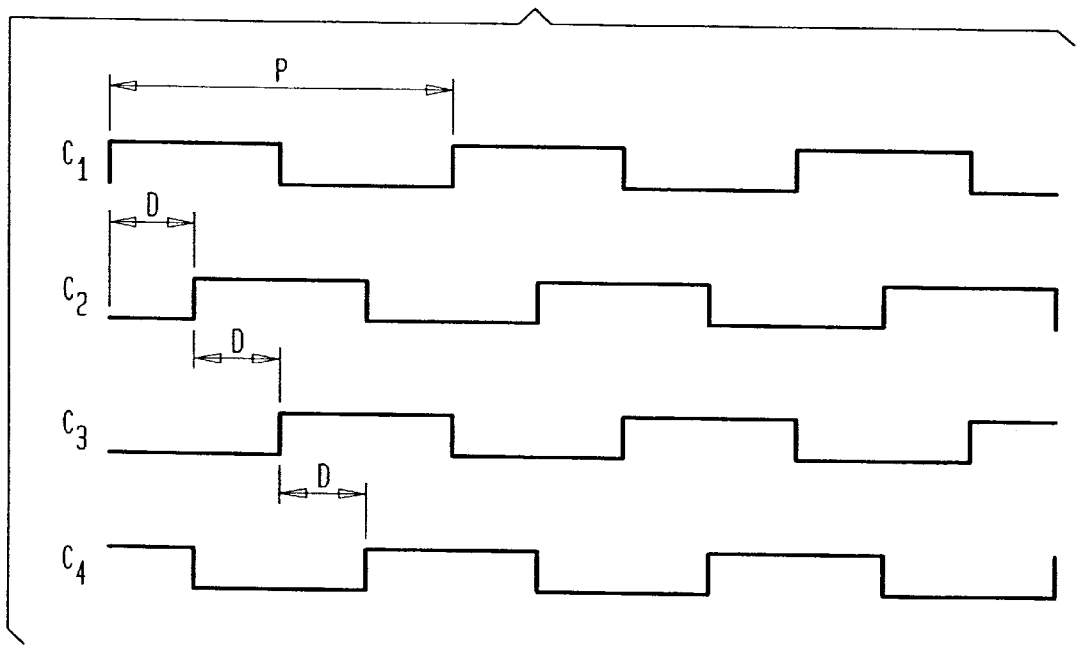
FIG. 1 illustrates a clock signal generated by a prior art clock generator.
Figure 5:
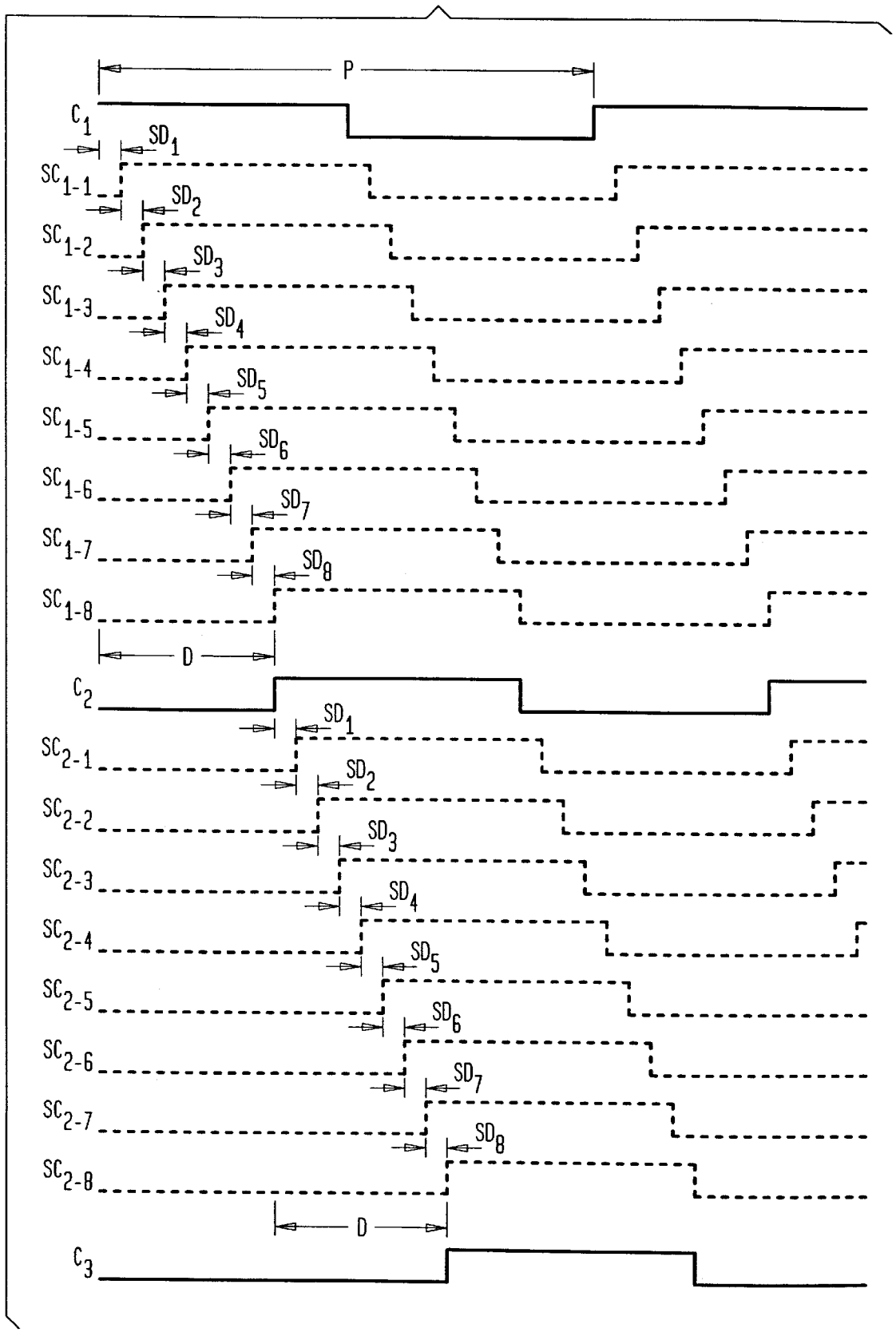
FIG. 5 illustrates the super position of sub-clock pulses on regular clock pulses in accordance with the present invention.

FIG. 5 illustrates clock pulses $C_1$ and $C_2$ of FIG. 1, with eight sub-clocks $SC_1$ through $SC_8$ shown interposed between the clock pulses. Thus, for example, if a user supplied a digital 0 to any two of the control inputs of FIG. 4 (e.g., $CI_1$ and $CI_2$) and supplied digital 1's to the remaining control inputs (e.g., $CI_3$ through $CI_8$), then six of the diode-connected transistors (MN38 through MN43) would be active and the remaining diode-connected transistors (MN 36 and MN37) would be inactive, and the equivalent of two sub-delays would be added to each clock signal $C_1$ through $C_4$ (only $C_1$ and $C_2$ shown in FIG. 5) so that the outputs $ST_1$ and $ST_2$ of delay cells 32 and 34, respectively would correspond to sub-clock signals $SC_{1-2}$ and $SC_{2-2}$, respectively, of FIG. 5. The outputs of delay cells 36 and 38 would also be delayed accordingly.

In this example, eight selectable sub-delays are illustrated; however, any number of sub-delays could be utilized depending upon the needs of the user.

By introducing this additional delay via the subtaps, a user can specify any desired clock phase, limited only by the number of subtaps utilized, and the change can be implemental at any time, i.e., the phase is variable.

While there has been described herein the principles of the invention, it is to be understood by those skilled in the art that this description is made only by way of example and not as a limitation to the scope of the invention. For example, while the disclosure makes specific reference to utilization of a maximum voltage $V_{MAX}$ and a minimum voltage $V_{MIN}$, one of ordinary skill in the art would recognize that simple conversions will allow the use of a maximum current $C_{MAX}$ and a minimum current $C_{MIN}$ to accomplish the same result. Accordingly, it is intended by the appending claims, to cover all modifications of the invention which fall within the true spirit and scope of the invention.

We claim:

1. A method of selectively adding delay to clock signals generated by a clock generator that includes one or more delay elements capable of adding a delay to the generated clock signals, comprising the steps of:

establishing a range of delay, from a minimum delay $D_{MIN}$ to a maximum delay $D_{MAX}$, achievable using one of said delay elements, by at least:

generating a first clock signal and adding thereto an amount of delay equal to a minimum delay achievable by one of said delay elements;

generating a second clock signal and adding thereto an amount of delay equal to a maximum delay achievable by one of said delay elements; and comparing said first clock signal and said second clock signal to determine the difference therebetween, thereby establishing said range of delay;

generating one or more sub-delays $D_s$ of a size less than $D_{MAX}$ by at least:

dividing said range into a predetermined number of subdivisions corresponding to the number of sub-delays $D_s$ to be created; and outputting a sub-delay $D_s$ corresponding to each of said subdivisions; and adding one or more of said sub-delays $D_s$ to the generated clock signals by at least:

receiving a control input indicating a total number of sub-delays $D_s$ to be added to the generated clock signals; and adding the total number of sub-delays $D_s$ to each generated clock signal.

2. An integrated circuit having a clock generator for generating a plurality of phase-aligned clock signals based on a generated reference clock signal, comprising:

a phase-locked-loop (PLL) generating a plurality of phase-shifted clock signals;

a reference feedback loop connected to receive two of said phase-shifted clock signals generated by said PLL and outputting a bias voltage; and a phase control block coupled to receive control inputs and said bias voltage, said control inputs determining the size of a sub-delay to be added to said phase-shifted clock signals.

3. An integrated circuit as set forth in claim 2, wherein said phase control block comprises:

a digital-to-analog converter (DAC) connected to receive said control inputs and said bias voltage, and outputting a control voltage;

a plurality of sub-delay elements connected to receive said phase-shifted clock signals and said control voltage, wherein said delay elements add said control voltage to said phase-shifted clock signals, thereby adding said sub-delay to said phase-shifted clock signals.

4. An integrated circuit as set forth in claim 3, wherein the number of sub-delay elements corresponds to the number of phase-shifted clock signals generated by said PLL, with one each of said phase-shifted clock signals being input to one each of said sub-delay elements.

5. An integrated circuit as set forth in claim 4, wherein said sub-delay elements comprise delay adders.

6. An integrated circuit as set forth in claim 2, wherein said reference feedback loop comprises:

a reference DAC outputting a voltage $V_{MIN}$ and a voltage $V_{MAX}$;

a first delay element coupled to receive a first of said two phase-shifted clock signals and said voltage $V_{MAX}$ and outputting a maximum delayed phase-shifted clock signal;

a second delay element coupled to receive a second of said two phase-shifted clock signals and said voltage $V_{MIN}$ and outputting a minimum delayed phase-shifted clock signal;

a phase comparator/filter coupled to receive said maximum and minimum phase-shifted clock signals from said first and second delay elements and outputting said bias voltage, wherein said bias voltage is input to said reference DAC to keep said phase-shifted clocks phase-aligned.

7. An integrated circuit as set forth in claim 2, wherein said reference feedback loop comprises:

a first delay element coupled to receive a first of said two phase-shifted clock signals and a voltage $V_{MAX}$ and outputting a maximum delayed phase-shifted clock signal;

a second delay element coupled to receive a second of said two phase-shifted clock signals and a voltage $V_{MIN}$ and outputting a minimum delayed phase-shifted clock signal;

a phase comparator/filter coupled to receive said maximum and minimum phase-shifted clock signals from said first and second delay elements and outputting said bias voltage, wherein said bias voltage is input to said reference DAC to keep said phase-shifted clocks phase-aligned.

8. An integrated circuit as set forth in claim 2, wherein said reference feedback loop comprises:

a reference DAC outputting a current $C_{MIN}$ and a current $C_{MAX}$;

a first delay element coupled to receive a first of said two phase-shifted clock signals and said current $C_{MAX}$ and outputting a maximum delayed phase-shifted clock signal;

a second delay element coupled to receive a second of said two phase-shifted clock signals and said current $C_{MIN}$ and outputting a minimum delayed phase-shifted clock signal;

a phase comparator/filter coupled to receive said maximum and minimum phase-shifted clock signals from said first and second delay elements and outputting said bias voltage, wherein said bias voltage is input to said reference DAC to keep said phase-shifted clocks phase-aligned.

9. An integrated circuit as set forth in claim 2, wherein said reference feedback loop comprises:

a first delay element coupled to receive a first of said two phase-shifted clock signals and a current $C_{MAX}$ and outputting a maximum delayed phase-shifted clock signal;

a second delay element coupled to receive a second of said two phase-shifted clock signals and a current $C_{MIN}$ and outputting a minimum delayed phase-shifted clock signal;

a phase comparator/filter coupled to receive said maximum and minimum phase-shifted clock signals from said first and second delay elements and outputting said bias voltage, wherein said bias voltage is input to said reference DAC to keep said phase-shifted clocks phase-aligned.

* * * * *